United States Patent
Wu et al.

(10) Patent No.: US 7,528,045 B2
(45) Date of Patent: May 5, 2009

(54) MOS TRANSISTOR AND MANUFACTURING METHODS THEREOF

(75) Inventors: Chih-Chiang Wu, Taichung County (TW); Shih-Fang Tzou, Hsinchu (TW); Shih-Chieh Hsu, Hsinchu (TW); Jen-Hong Huang, Tao-Yuan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 11/669,164

(22) Filed: Jan. 31, 2007

(65) Prior Publication Data
US 2008/0179626 A1     Jul. 31, 2008

(51) Int. Cl.
*H01L 21/8238* (2006.01)
(52) U.S. Cl. ............... 438/296; 438/221; 438/222; 438/197; 257/E21.231
(58) Field of Classification Search ............... 438/300
See application file for complete search history.

(56) References Cited

U.S. PATENT DOCUMENTS

| | | | |
|---|---|---|---|
| 6,541,343 B1* | 4/2003 | Murthy et al. | 438/299 |
| 6,887,762 B1* | 5/2005 | Murthy et al. | 438/300 |
| 7,195,985 B2* | 3/2007 | Murthy et al. | 438/341 |
| 7,314,804 B2* | 1/2008 | Lindert et al. | 438/305 |
| 2007/0020864 A1* | 1/2007 | Chong et al. | 438/300 |
| 2007/0264765 A1* | 11/2007 | Lan et al. | 438/199 |

* cited by examiner

*Primary Examiner*—Matthew Smith
*Assistant Examiner*—Phillip Green
(74) *Attorney, Agent, or Firm*—Winston Hsu

(57) ABSTRACT

A method for manufacturing a metal-oxide semiconductor (MOS) transistor includes providing a substrate having at least a gate structure and a shallow trench isolation (STI) formed thereon, performing a first etching process to form recesses in the substrate respectively at two sides of the gate structure, performing a selective epitaxial growth (SEG) process to form epitaxial silicon layers in the recesses respectively, accordingly a seam is formed in between the epitaxial silicon layer and the STI, forming a dielectric layer in the seam, and performing a self-aligned silicide (salicide) process.

13 Claims, 15 Drawing Sheets

MOS TRANSISTOR AND MANUFACTURING METHODS THEREOF

BACKGROUND OF THE INVENTION

1. Field of the Invention

The present invention relates to a metal-oxide semiconductor (MOS) transistor and manufacturing methods thereof, and more particularly, to a MOS transistor and manufacturing methods thereof utilizing selective epitaxial growth (SEG) method.

2. Description of the Prior Art

Selective epitaxial growth (SEG) technology is used to form an epitaxial silicon layer on a single-crystalline substrate, in which the crystalline orientation of the epitaxial silicon layer is almost identical to that of the substrate. SEG technology is widely applied in manufacturing numerous kinds of semiconductor devices, such as MOS transistors having raised source/drain regions which benefits from good short channel character and low parasitical resistance and a MOS transistor having recessed source/drain which improves drain induced barrier lowering (DIBL) and punchthrough effect and reduces off-state current leakage and power consumption.

Generally, SEG technology includes performing a cleaning process to remove native oxides and other impurities from a surface of a substrate, then depositing an epitaxial silicon layer on the substrate and making the epitaxial silicon layer grow along with the silicon lattice of the substrate. Please refer to FIGS. 1-4, which are drawings illustrating a conventional method for manufacturing a MOS transistor utilizing SEG technology. As shown in FIG. 1, a substrate 100, such as a silicon substrate, is provided. The substrate 100 comprises a gate structure 110 having a gate dielectric layer 112, a gate conductive layer 114 formed on the gate dielectric layer 112, a hard mask layer 116 formed on the gate conductive layer 114 for defining and protecting the gate conductive layer 114, lightly doped drains (LDDs) 118 formed in the substrate 100 on two sides of the gate conductive layer 114, and a spacer 120 formed on sidewalls of the gate conductive layer 114. Additionally, active areas where the gate structure 110 is positioned are electrically isolated from each other by a shallow trench isolations (STIs) 130.

Please refer to FIG. 2. A patterned cap layer 140 is formed on the substrate 100 acting as a mask in an etching process. Then an isotropic dry etching process is performed to form recesses 150 in the substrate 100 where the patterned cap layer 140 does not cover. Please refer to FIG. 3. After a cleaning process used to remove native oxides and other impurities is performed, a SEG process is performed by filling the recesses 150 with an epitaxial silicon layer 152, such as a silicon germanium (SiGe) layer, to form a source/drain of a PMOS transistor.

Please refer to FIG. 3 again. The epitaxial silicon layer 152 grows along the silicon surface of the substrate 100 in the recess 150 and is in an identical orientation with the silicon lattice of the substrate 100. For example, the epitaxial silicon layer 152 grows along the arrow shown in FIG. 3. However, the STI 130 is filled with silicon oxide material, therefore a seam 154 is formed in between the epitaxial silicon layer 152 and the STI 130 after the SEG process. It is noteworthy that since many processes will be performed to clean the substrate 100 and to remove the hard mask layer 140 and the cap layer 116 after forming the epitaxial silicon layer 152, the seam 154 will successively grow larger and deeper into the epitaxial silicon layer 152, even exposing the substrate 100.

Please refer to FIG. 4. In the following process such as a self-align silicidation (Salicide) process, a metal layer (not shown) sputtered on the substrate 100 will react with silicon atom of the substrate 100 and result in a salicide layer 160. The existence of the seam 154 makes the silicon atoms of the epitaxial silicon layer 152 consumed by the metal layer excessively, and even exposes the substrate 100 to the metal layer. Therefore the salicide layer 160 may form under the STI 130 and cause current leakage.

SUMMARY OF THE INVENTION

Therefore the present invention provides a MOS transistor and manufacturing methods thereof to prevent the current leakage around the STI.

According to the claimed invention, a method for manufacturing a MOS transistor is provided. The method comprises steps of providing a substrate having at least a gate structure and a shallow trench isolation (STI) formed thereon, performing a first etching process to form recesses in the substrate respectively on two sides of the gate structure, performing a selective epitaxial growth (SEG) process to form epitaxial silicon layers in the recesses respectively, a seam being accordingly formed between the epitaxial silicon layer and the STI, forming a dielectric layer in the seam, and performing a self-aligned silicidation (salicide) process.

According to the claimed invention, another method for manufacturing a MOS transistor is provided. The method comprises steps of providing a substrate having at least a gate structure comprising a hard mask layer and a cap layer formed thereon and an STI, performing a first etching process to form recesses in the substrate respectively on two sides of the gate structure, performing an SEG process to form epitaxial silicon layers in the recesses respectively, a seam being accordingly formed between the epitaxial silicon layer and the STI, performing a deposition process to deposit a dielectric layer on the substrate, the dielectric layer filling the seams, performing a second etching process to remove the dielectric layer except the seams, the hard mask layer, and the cap layer, and performing a salicide process.

According to the claimed invention, a MOS transistor is further provided. The MOS transistor comprises a gate structure positioned in an active area defined in a substrate, a recessed source/drain, and an asymmetric shallow trench isolation (STI) for electrically isolating the active areas.

Accordingly, because a deposition process is performed after the SEG process, the deposited dielectric layer thus fills the seam formed in between the epitaxial silicon layer and the STI. Therefore the seams are prevented from enlarging and deepening in the following etching or cleaning processes, and thus the epitaxial silicon layer and the substrate is prevented from being excessively consumed in the salicide process. Consequently the current leaking caused by the existence of the seam is effectively improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
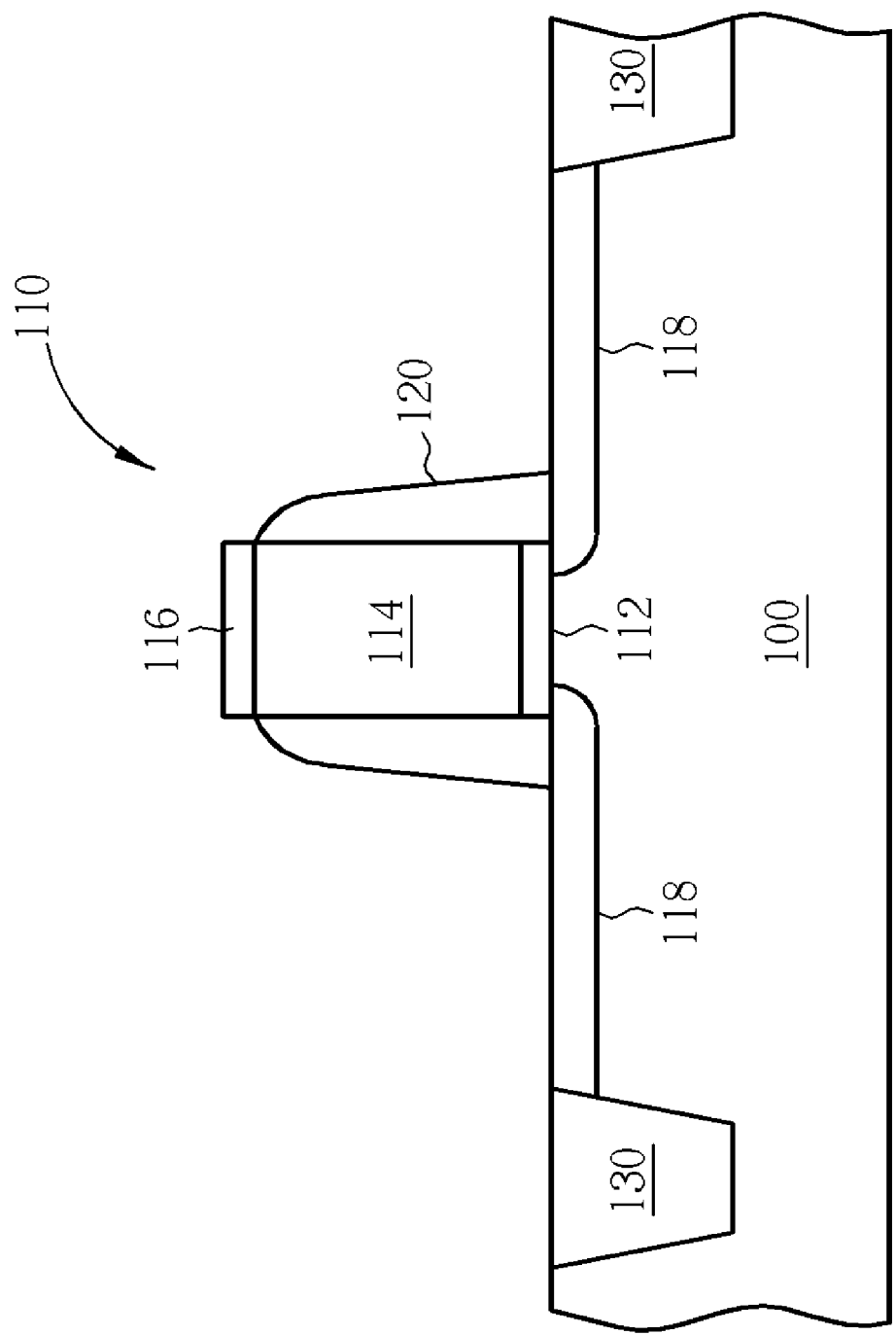
FIGS. 1-4 are schematic drawings illustrating a conventional method for manufacturing a MOS transistor utilizing SEG technology.
Figure 2:
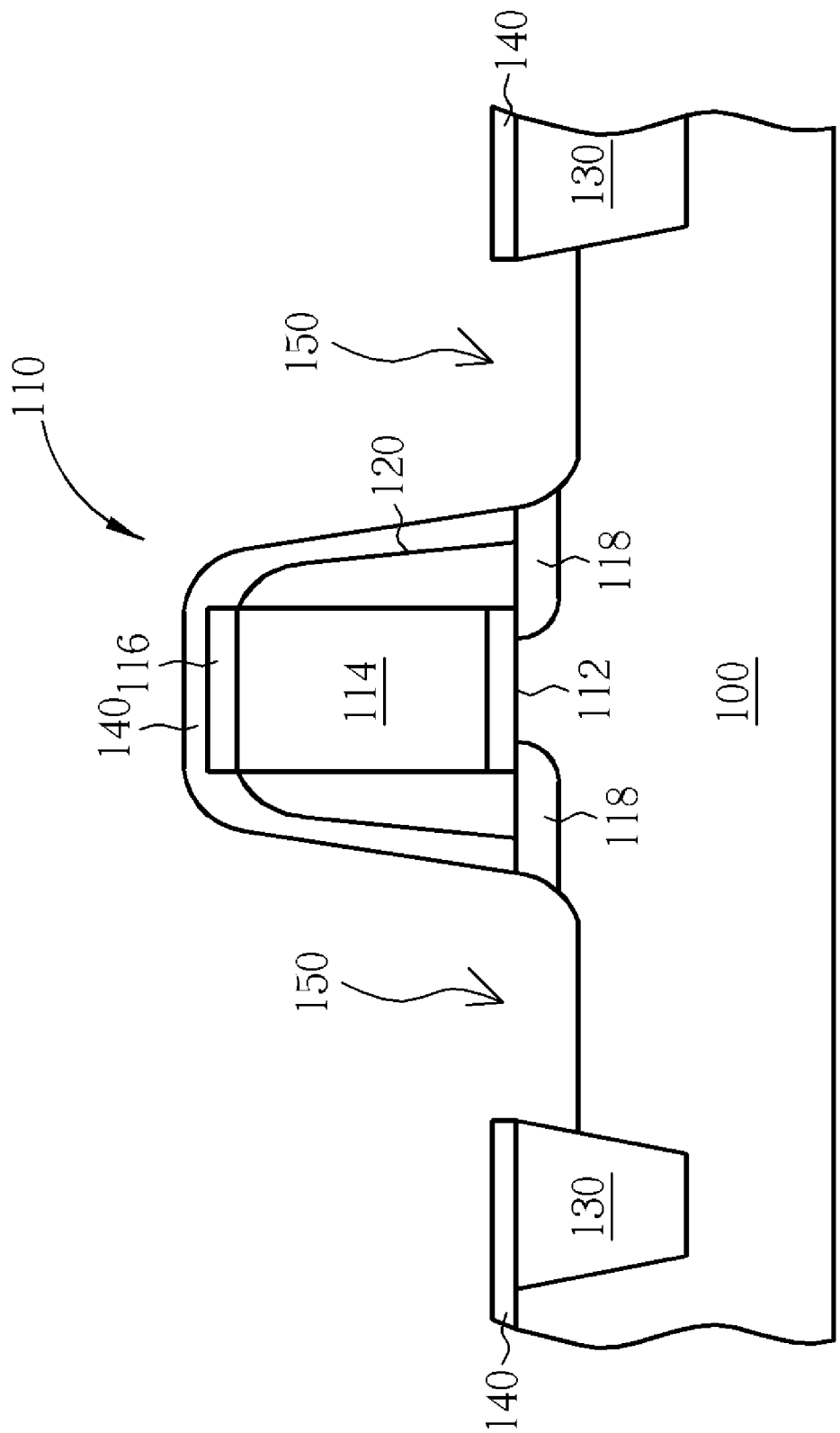
Figure 3:
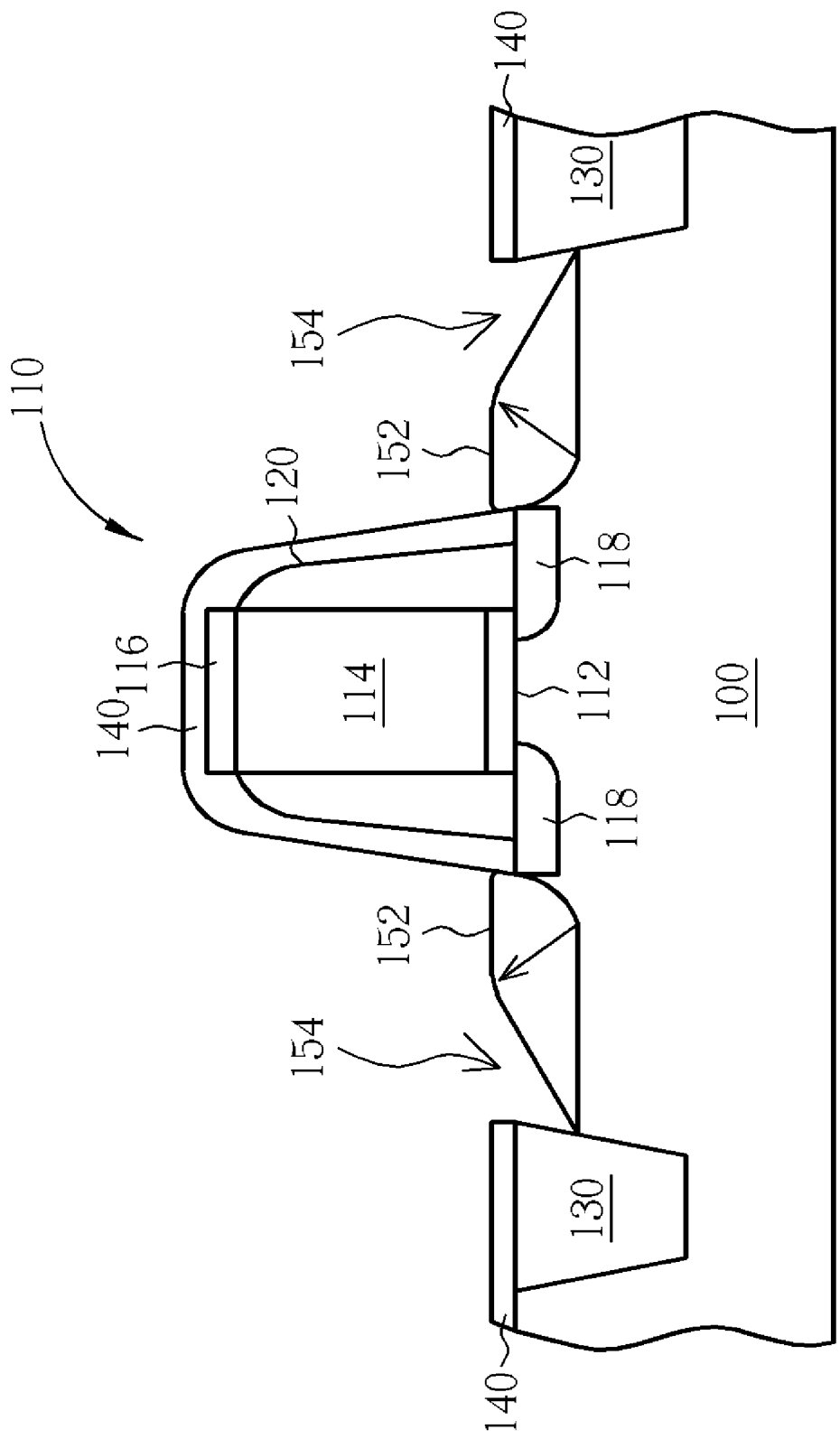
Figure 4:
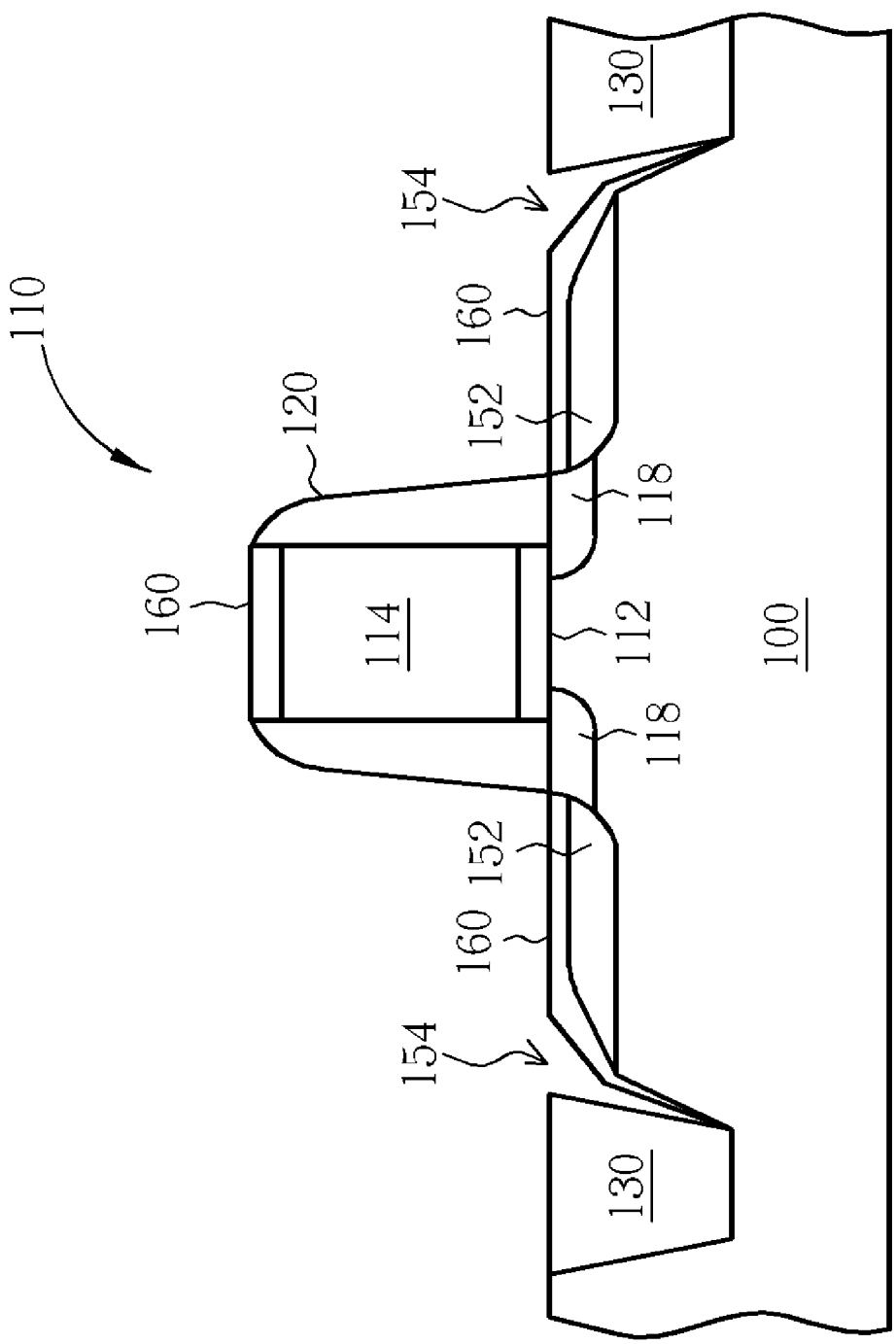
Figure 5:
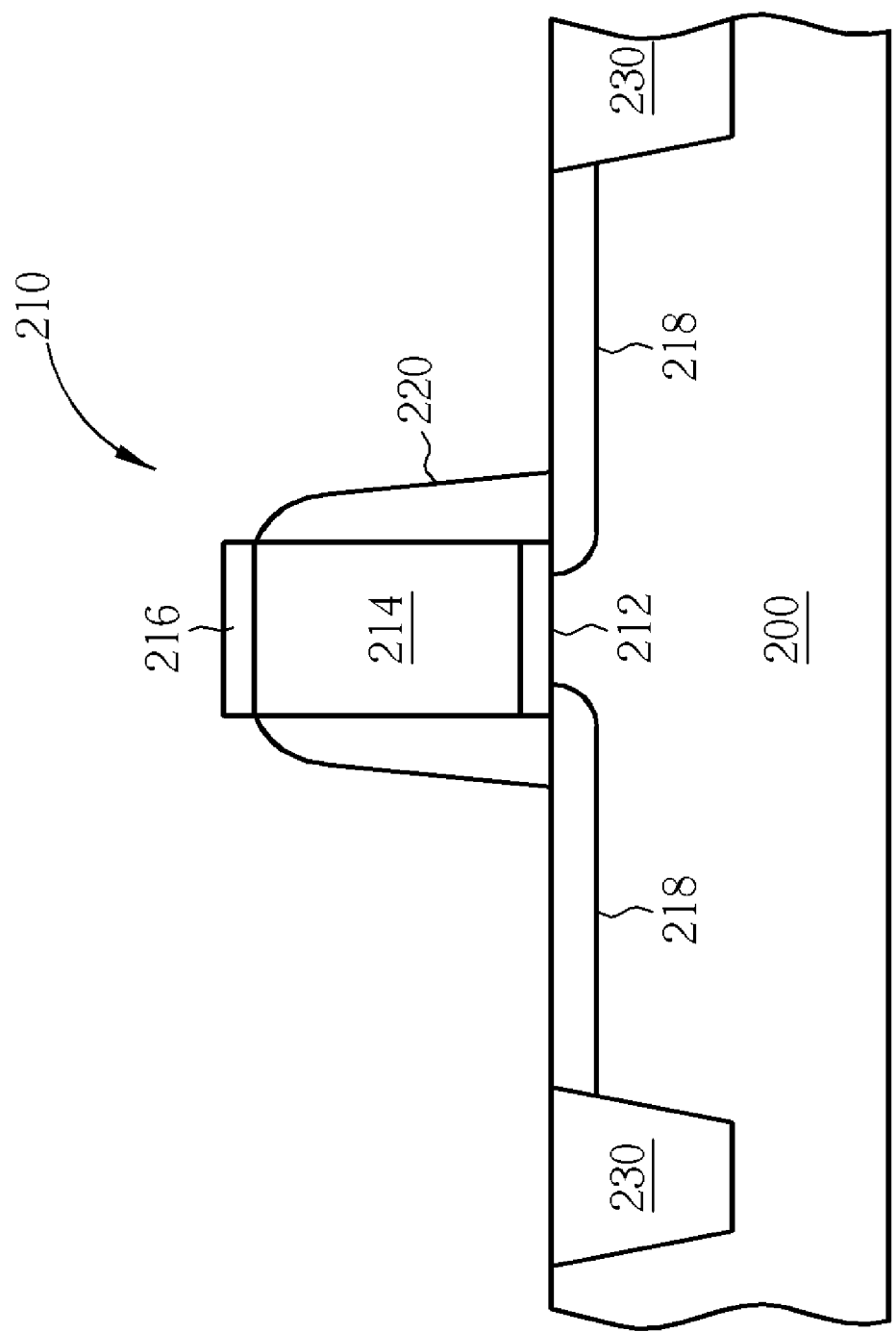
FIGS. 5-10 are schematic drawings illustrating a first preferred embodiment provided by the present invention.

Please refer to FIGS. 5-10, which are schematic drawings illustrating a first preferred embodiment provided by the present invention. As shown in FIG. 5, a substrate 200 having at least a gate structure 210 and a shallow trench isolation (STI) 230 is provided. The gate structure 210 comprises a gate dielectric layer 212, a gate conductive layer 214 formed on the gate dielectric layer 212, a hard mask layer 216 formed on the gate conductive layer 214, lightly doped drains (LDDs) 218 formed in the substrate 200 on two sides of the gate conductive layer 214, and a spacer 220 formed on sidewalls of the gate conductive layer 214.

Figure 6:
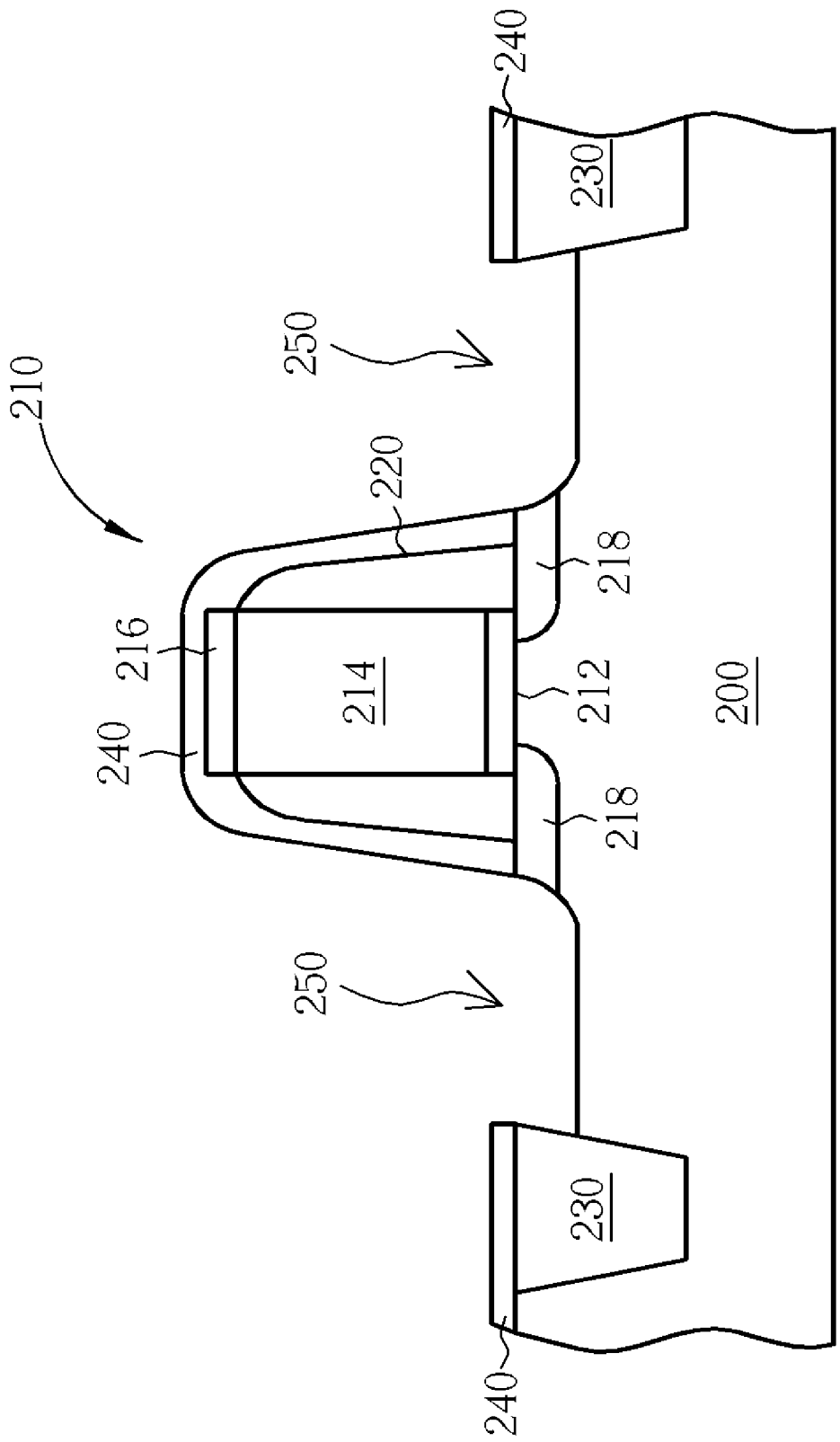

Please refer to FIG. 6. A first etching process is performed and a patterned cap layer 240 acting as a mask in the first etching process is selectively formed before the first etching process. Accordingly, recesses 250 are formed in the substrate 200 where the cap layer 240 does not cover. In addition, a first pre-cleaning step is performed after the first etching process to remove residuals from the substrate 200 and the recesses 250.

Figure 7:
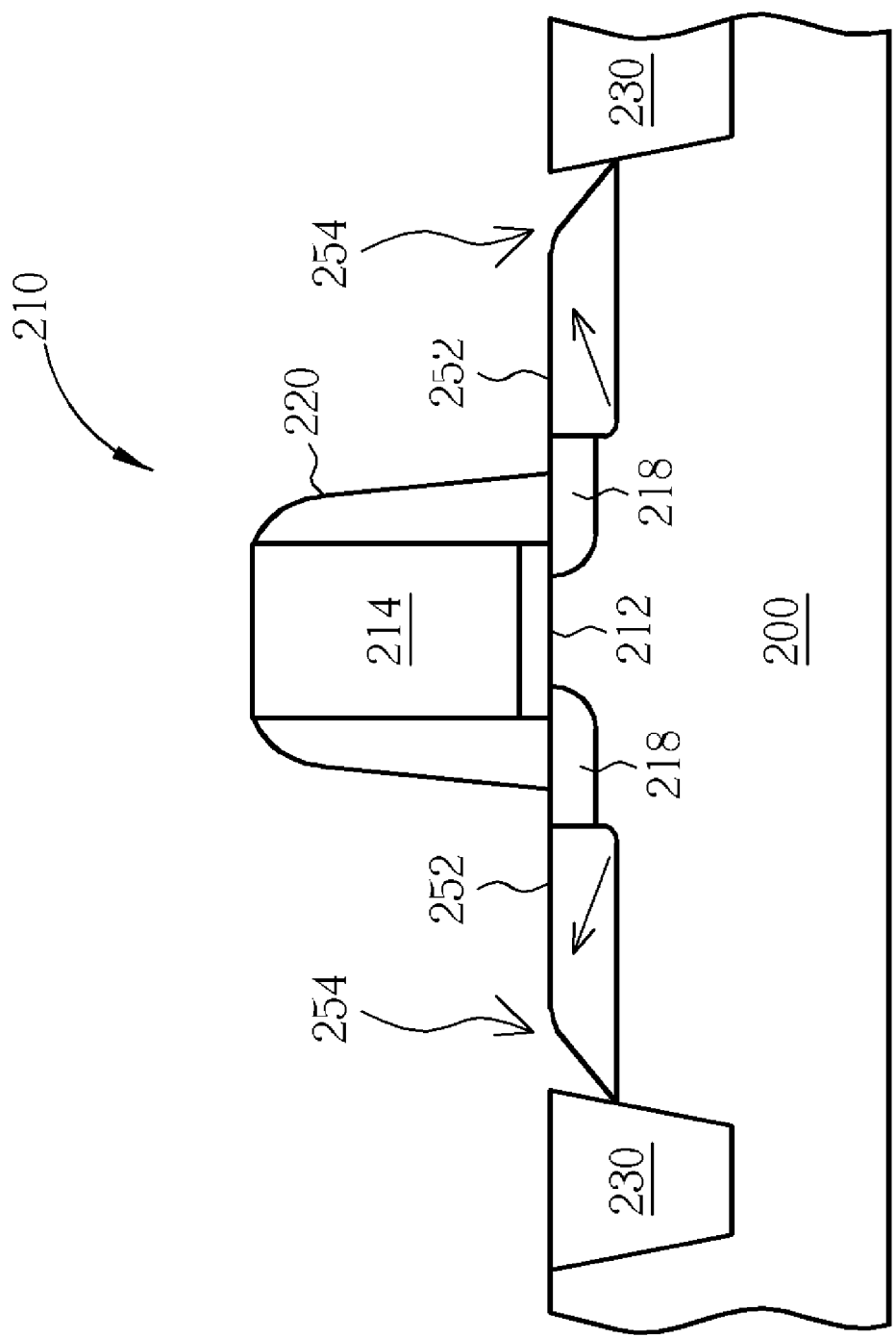

Please refer to FIG. 7. Next, a selective epitaxial growth (SEG) process is performed to form epitaxial silicon layers 252 in the recesses 250 respectively. When the gate structure 210 is a gate structure of a PMOS transistor, the epitaxial silicon layer 252 comprises silicon germanium (SiGe); when the gate structure 210 is a gate structure of an NMOS transistor, the epitaxial silicon layer 252 comprises silicon carbide (SiC). As shown in FIG. 7, a third etching process is performed after the SEG process to remove the hard mask layer 216 and the cap layer 240.

It is noteworthy that the epitaxial silicon layer 252 grows along the silicon lattice of the substrate 200 in the recess 250. As shown in FIG. 7, the (1,1,0) crystallographic substrate 200 provided by the first preferred embodiment makes the epitaxial silicon layer 252 grow in the identical (1,1,0) orientation. In other words, the epitaxial silicon layers 252 grows along the arrows shown in FIG. 7. Furthermore, because the STI 230 is filled with silicon oxide, the epitaxial silicon layer 252 cannot grow along a surface of the STI 230. Due to the two abovementioned growth characters, there is a seam 254 formed in between the epitaxial silicon layer 252 and the STI 230 after the SEG process.

Figure 8:
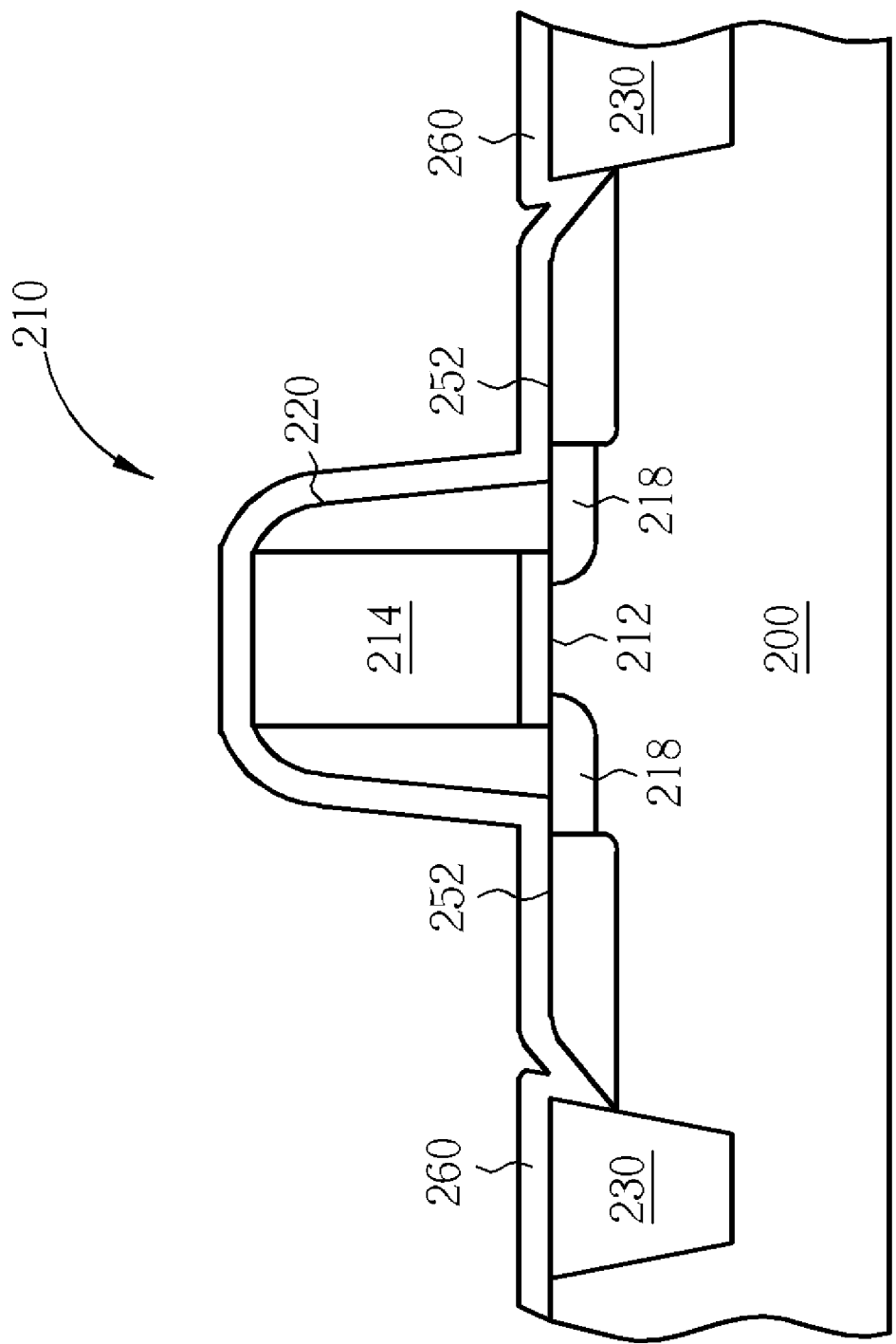

Please refer to FIG. 8. A deposition process is performed to form a dielectric layer 260 on the substrate 200. The deposition process comprises a high density plasma chemical vapor deposition (HDP-CVD), atmosphere pressure chemical vapor deposition (APCVD), sub-atmosphere chemical vapor deposition (SACVD), low pressure chemical vapor deposition (LPCVD), or plasma enhanced chemical vapor deposition (PECVD). Please note that the dielectric layer 260 fills the seams 254. The dielectric layer 260 comprises materials such as silicon oxide, silicon oxynitride, or silicon nitride.

Figure 9:
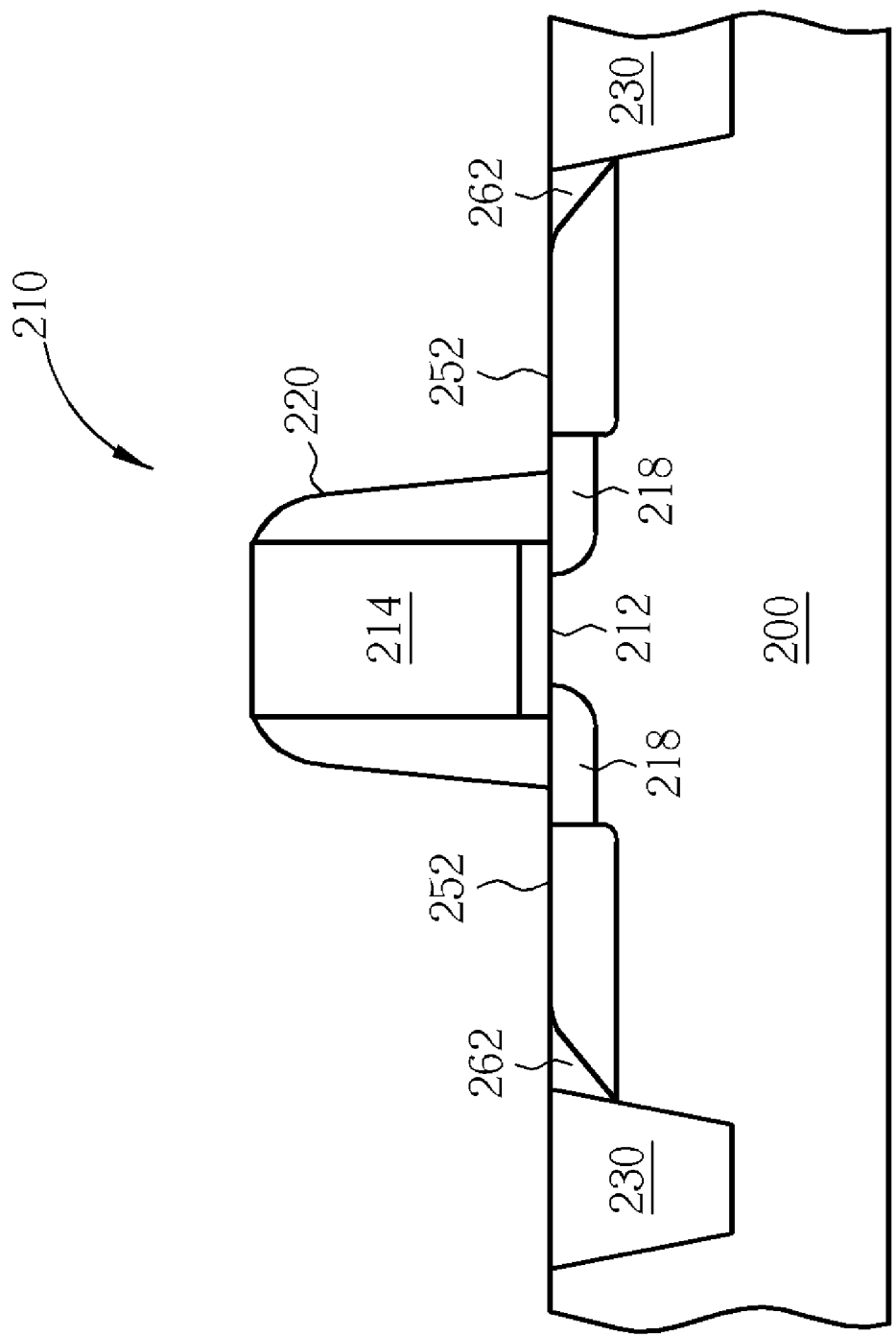

Please refer to FIG. 9. Next, a second etching process such as a dry etching process or a wet etching process is performed to remove the dielectric layer 260 except the seams 254, and thus dielectric layers 262 formed in and filled the seams 254 are obtained.

Figure 10:
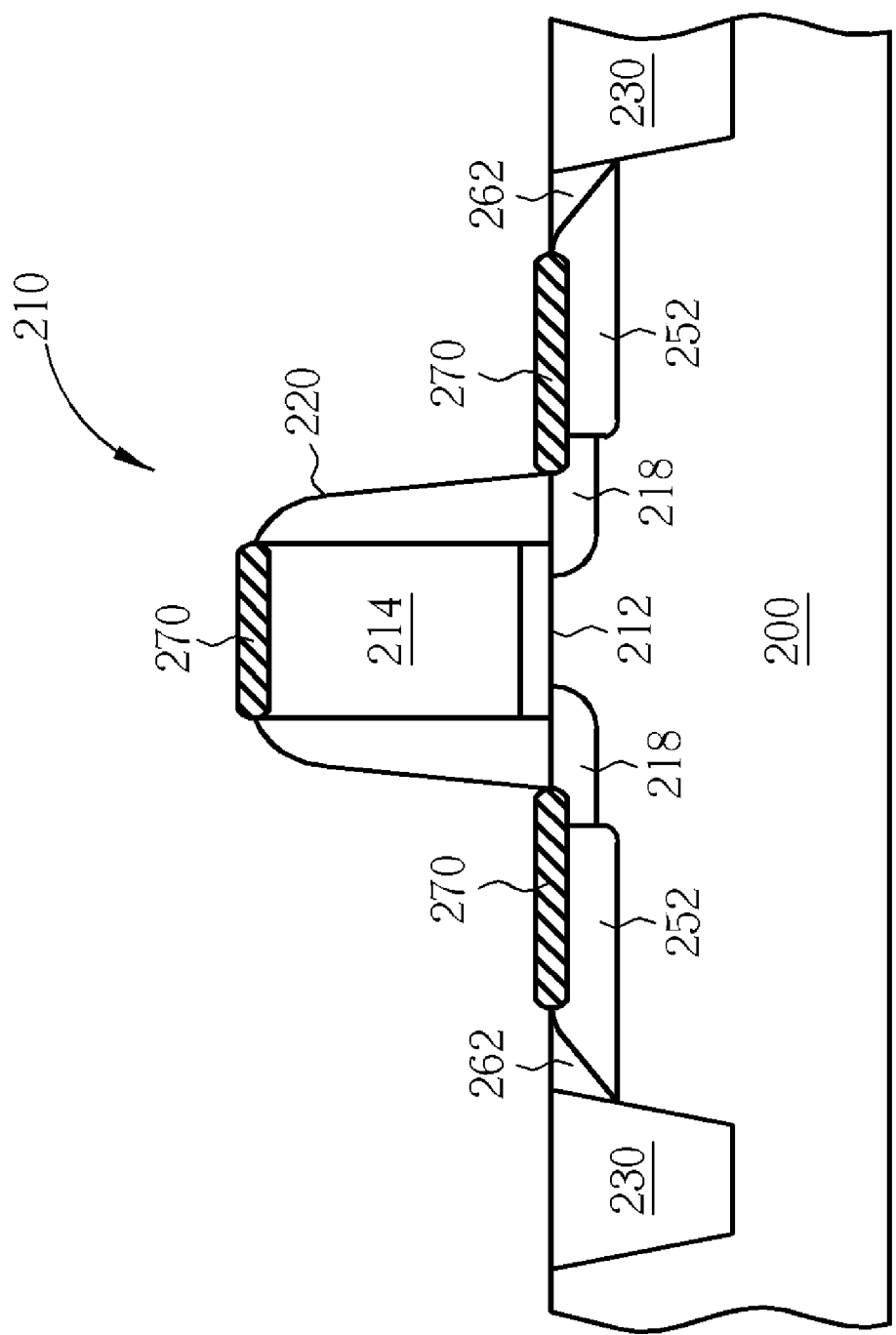

Please refer to FIG. 10. A self-aligned silicidation (salicide) process is performed to form a salicide layer 270 on the gate conductive layer 214, the LDDs 218, and the epitaxial silicon layers 252. In addition, a silicide barrier (SAB) layer such as a silicon dioxide layer or a silicon nitride layer (not shown) can be formed on the substrate 200 before the salicide process. The SAB layer is used to cover a portion of the substrate 200 or the gate structure 210 where the salicide layer 270 should not be formed. After forming the SAB layer, a second pre-cleaning step is performed to remove residuals from the substrate 200, the gate structure 210, and the epitaxial silicon layer 252, then the salicide process is performed.

In the first preferred embodiment, the seams 254 caused by the abovementioned growth characters of the epitaxial silicon layer are filled with the dielectric layers 262, therefore damages to the substrate 200 through the seams 254 during the following etching or cleaning processes are prevented by the filled dielectric layers 262. The dielectric layers 262 also prevent the epitaxial silicon layers 252 and the substrate 200 from excessive consumption through the seams 254 in the salicide process. Consequently, current leakage caused by the salicide which is formed under the STI 230 is prevented.

Figure 11:
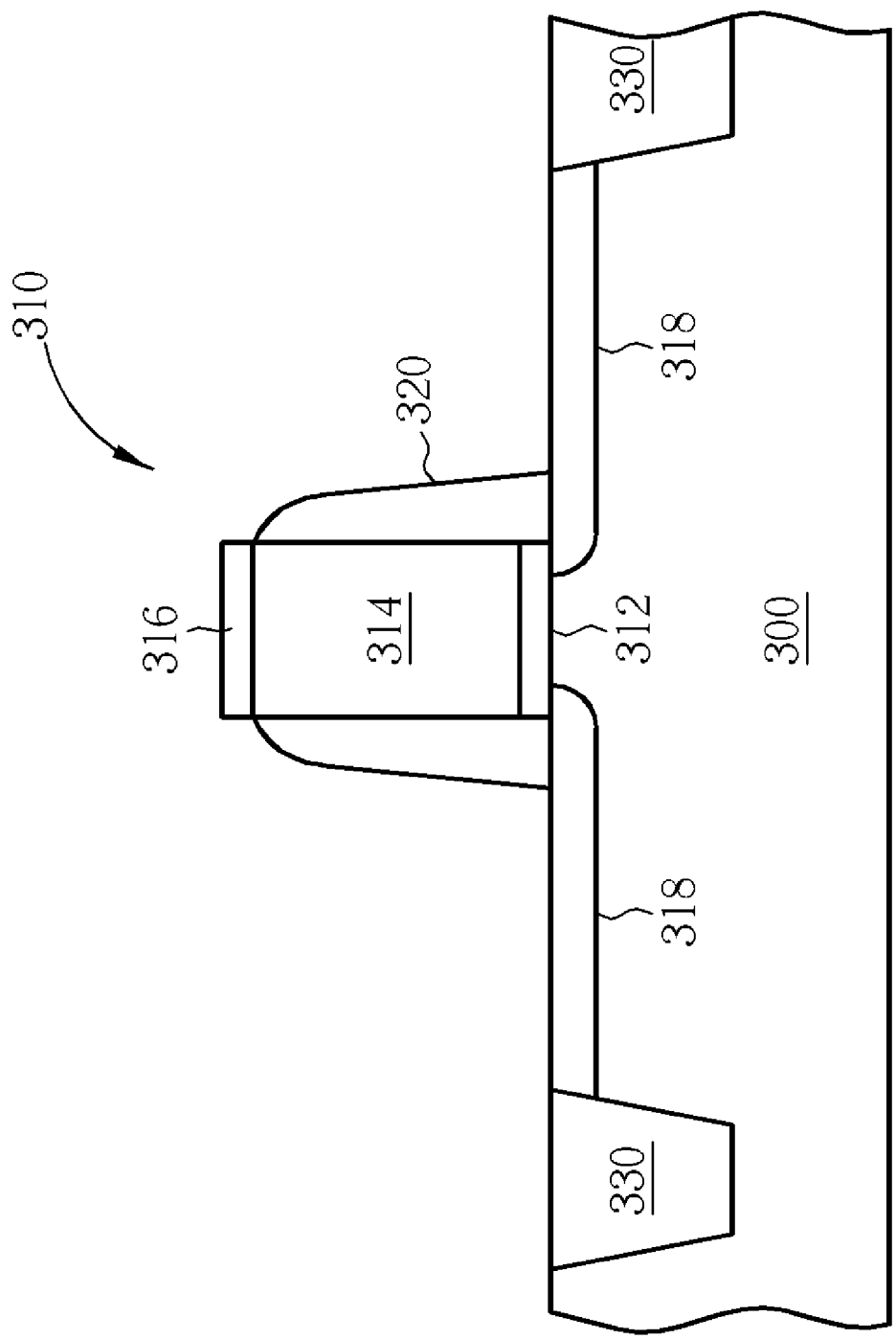
FIGS. 11-15 are schematic drawings illustrating a second preferred embodiment provided by the present invention.

Please refer to FIGS. 11-15, which are schematic drawings illustrating a second preferred embodiment provided by the present invention. As shown in FIG. 11, a substrate 300 having at least a gate structure 310 and a STI 330 is provided. The gate structure 310 comprises a gate dielectric layer 312, a gate conductive layer 314 formed on the gate dielectric layer 312, a hard mask layer 316 formed on the gate conductive layer 314, LDDs 318 formed in the substrate 300 on two sides of the gate conductive layer 314, and a spacer 320 formed on sidewalls of the gate conductive layer 314.

Figure 12:
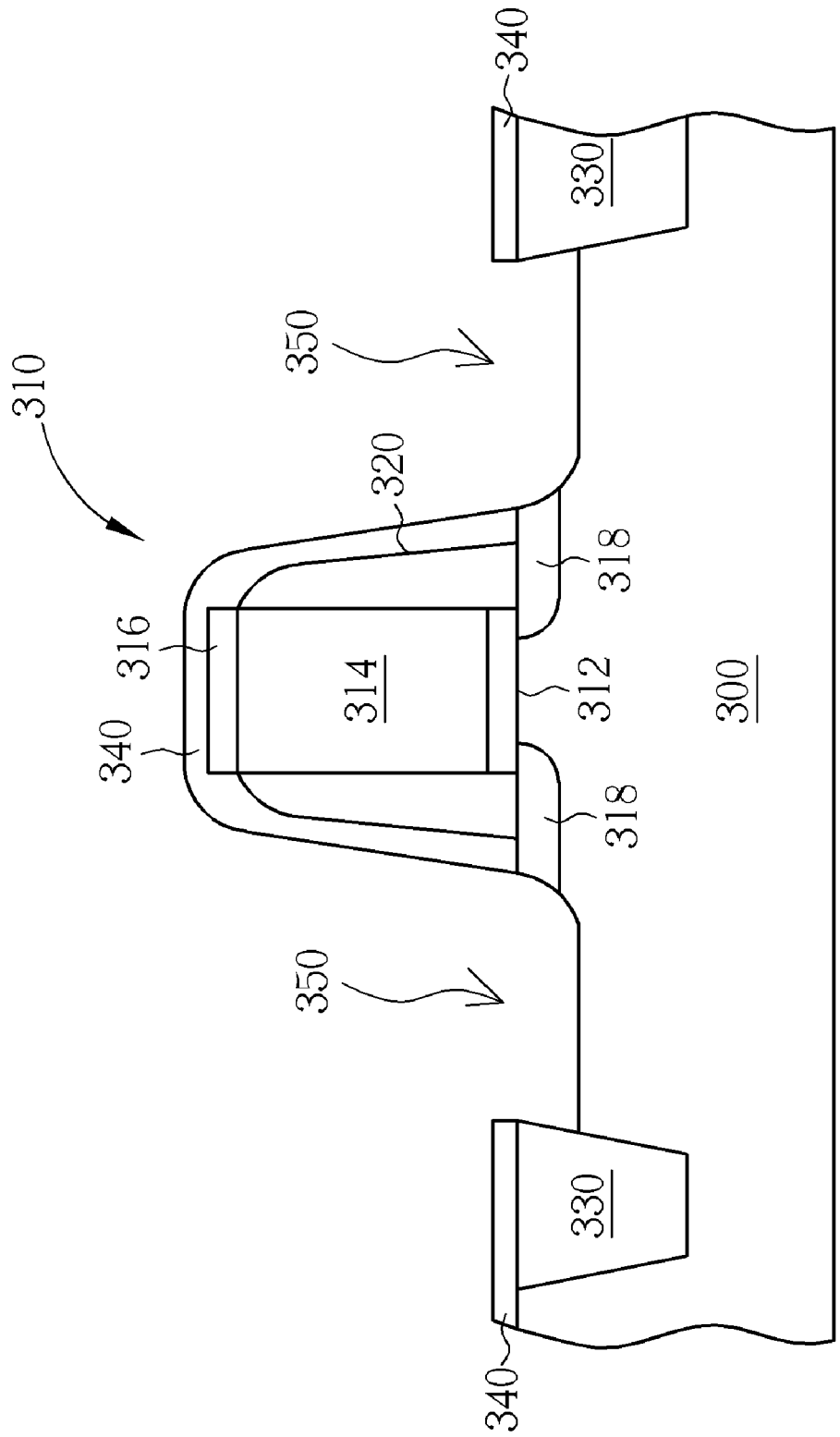

Please refer to FIG. 12. A first etching process is performed and a patterned cap layer 340 used as a mask in the first etching process is selectively formed before the first etching process. Accordingly, recesses 350 are formed in the substrate 300 where the cap layer 340 does not cover. In addition, a first pre-cleaning step is performed after the first etching process to remove residuals from the substrate 300 and the recesses 350.

Figure 13:
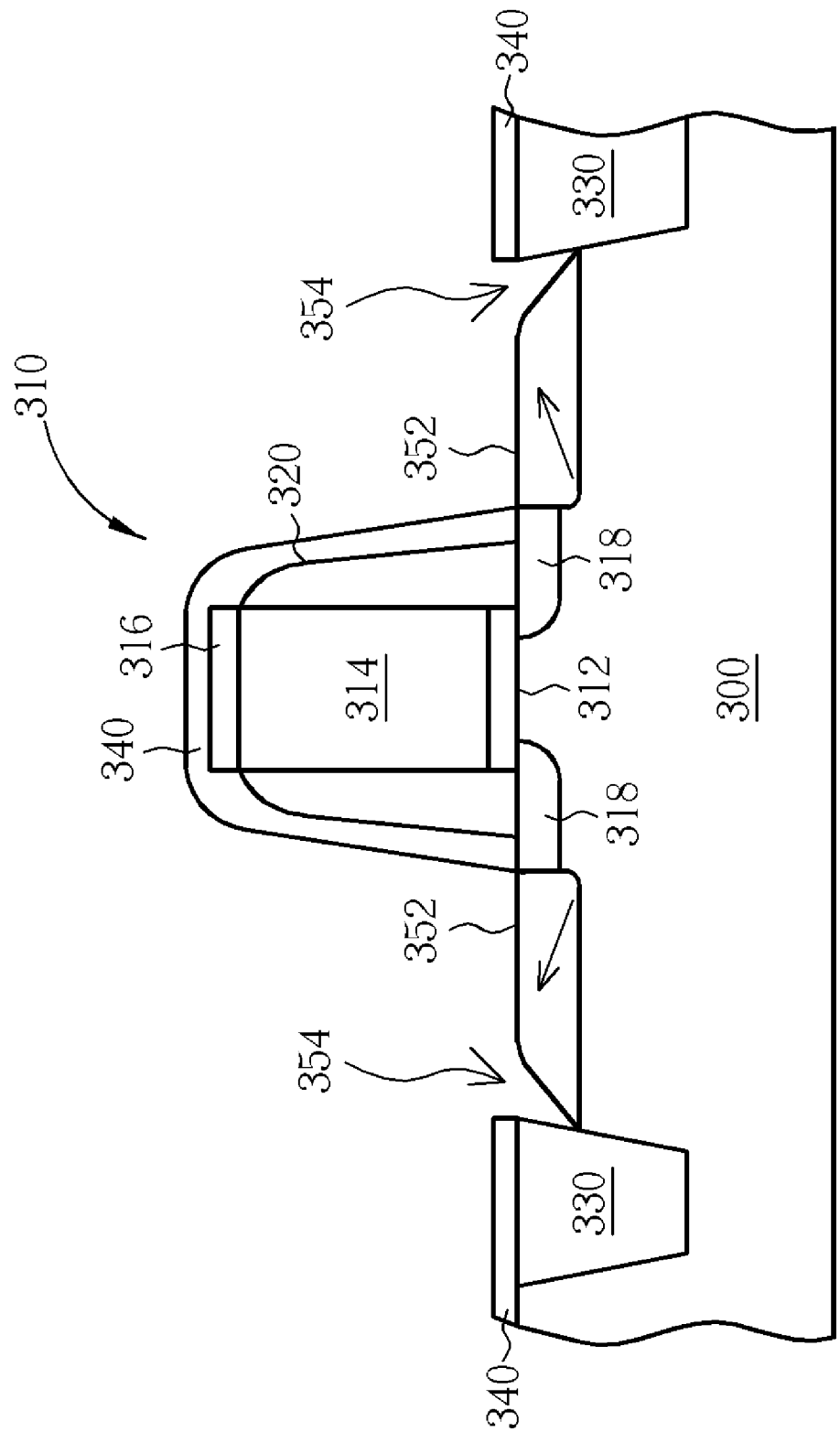

Please refer to FIG. 13. Next, a SEG process is performed to form epitaxial silicon layers 352 in the recesses 350 respectively. As mentioned above, because of the growth characters of the epitaxial silicon layers 352, there is a seam 354 formed in between the epitaxial silicon layer 352 and the STI 330.

Figure 14:
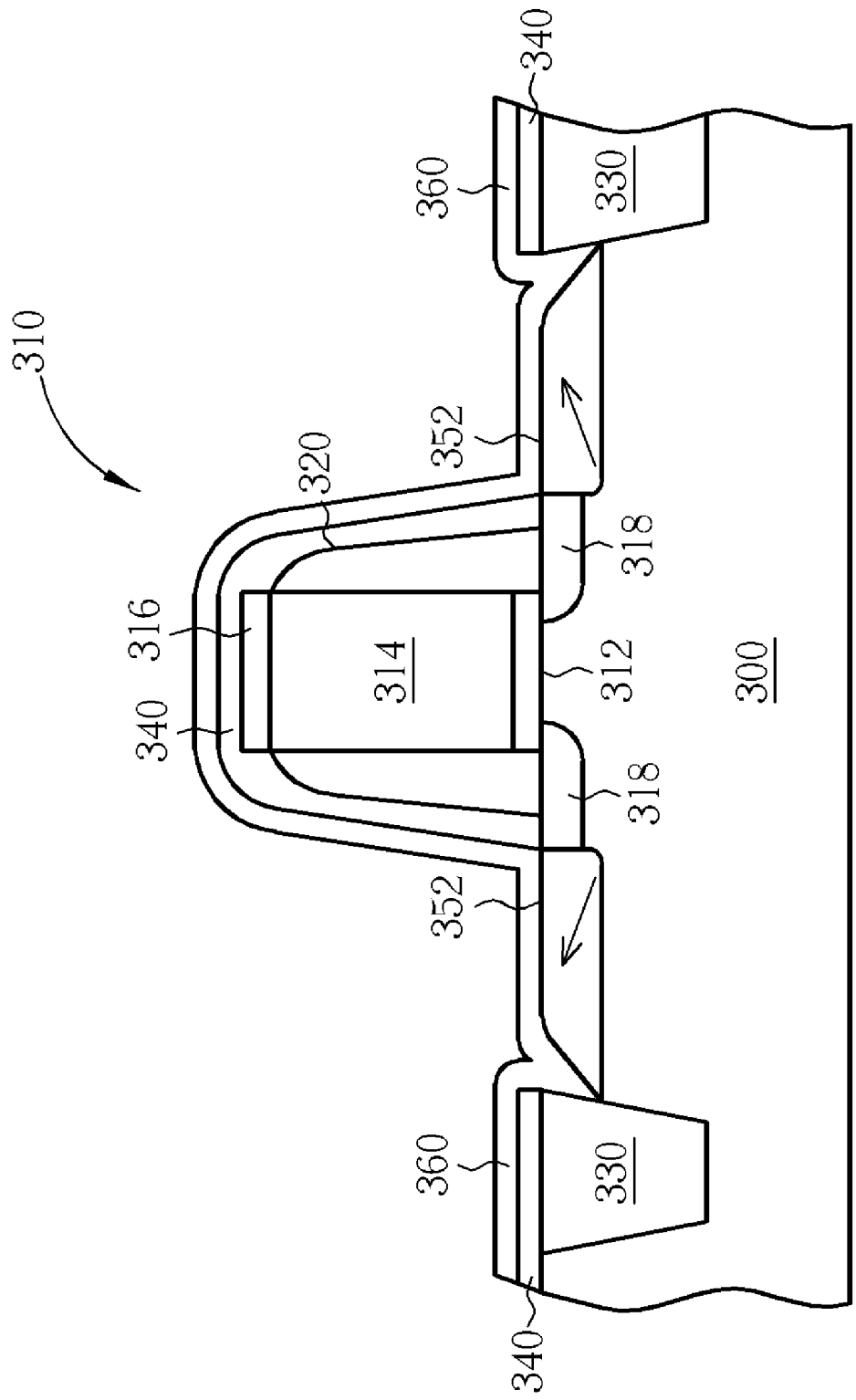
Figure 15:
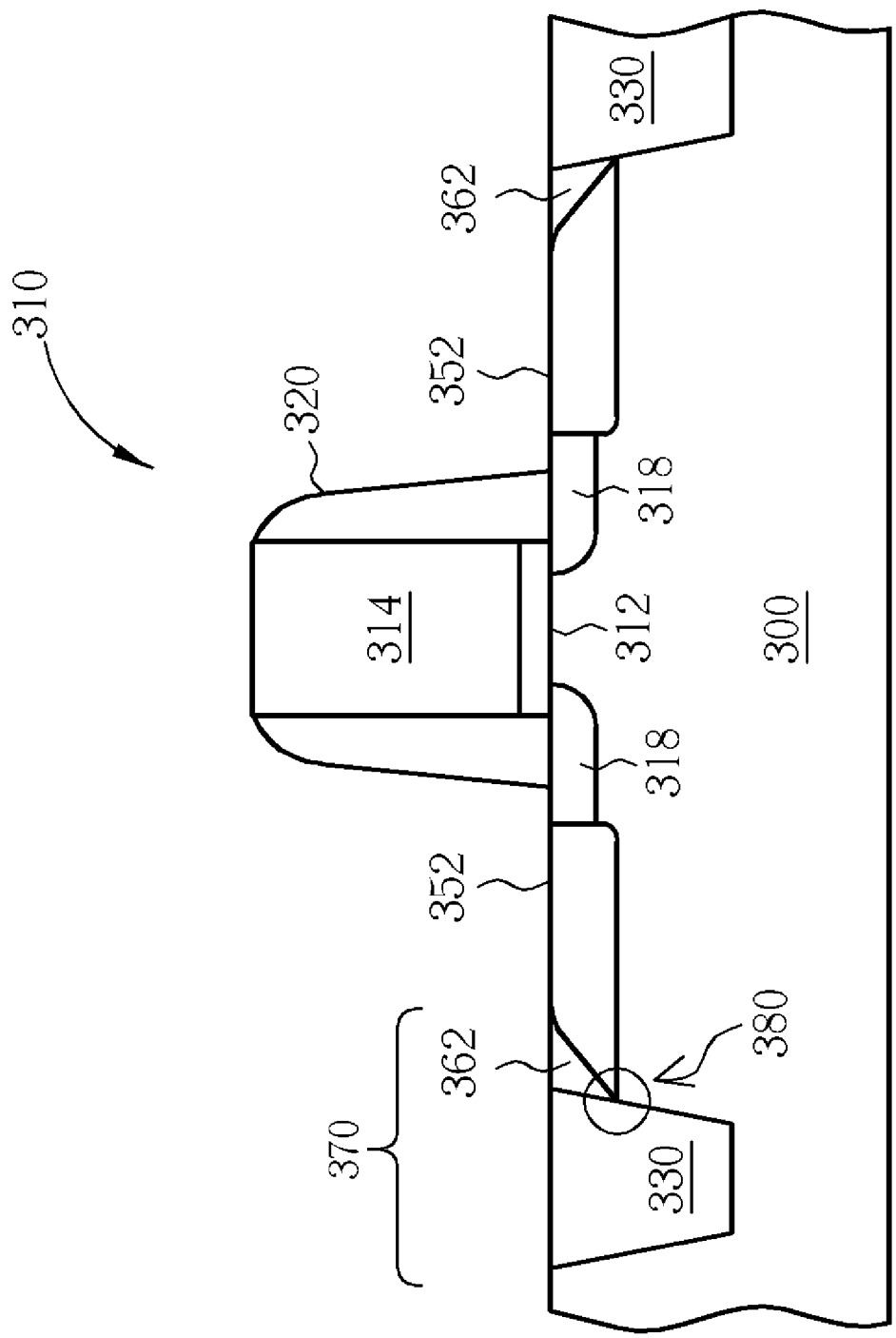

Please refer to FIGS. 14 and 15. A deposition process is performed to form a dielectric layer 360 on the substrate 300. The deposition process comprises a high density plasma chemical vapor deposition (HDP-CVD), atmosphere pressure chemical vapor deposition (APCVD), sub-atmosphere chemical vapor deposition (SACVD), low pressure chemical vapor deposition (LPCVD), or plasma enhanced chemical vapor deposition (PECVD). Please note that the dielectric layer 360 fills the seams 354. The dielectric layer 360 comprises materials such as silicon oxide, silicon oxynitride, or silicon nitride. As shown in the FIG. 15, a second etching process such as a dry etching process or a wet etching process is performed to remove the dielectric layer 360 except the seams 354, the hard mask layer 316, and the cap layer 340, and thus dielectric layers 362 formed in and filled the seams 354 are obtained.

Next, the substrate 300 undergoes a salicide process. Because the process is similar to the process in the first preferred embodiment, further description of the process is omitted in the interest of brevity in the second embodiment.

In the second preferred embodiment, the seams 354 caused by the abovementioned growth characters of the epitaxial silicon layer 352 are filled with the dielectric layers 362, therefore damages to the substrate 300 through the seams 354 during the following etching or cleaning processes are prevented by the filled dielectric layer 362. The dielectric layers 362 also prevent the epitaxial silicon layers 352 and the substrate 300 from excessive consumption through the seams 354 in the salicide process. Consequently, current leakage caused by the salicide which is formed under the STI 330 is prevented. Furthermore, because the dielectric layer 360 except the seams 354, the hard mask layer 316, and the cap layer 340 are removed simultaneously, the processes are simplified and damages to the substrate 300 in the etching or cleaning processes are accordingly reduced.

The present invention herein also provides a MOS transistor. Please refer to FIG. 15 again. The MOS transistor comprises a gate structure 310 positioned in an active area defined on a substrate 300. The gate structure 310 comprises a gate dielectric layer 312, a gate conductive layer 314 formed on the gate dielectric layer 312, a spacer 320 formed on sidewalls of the gate conductive layer 314, and LDDs 318 formed in two sides of the gate conductive layer 314.

Please refer to FIG. 15 again. The provided MOS transistor further comprises epitaxial silicon layers 352 used to be recessed source/drain and an asymmetric STI 370 for electrically isolating the active areas. When the MOS transistor is a PMOS transistor, the recessed source/drain comprises silicon germanium (SiGe); when the MOS transistor is an NMOS transistor, the recessed source/drain comprises silicon carbide (SiC).

It is noteworthy that the STI 370 provided by the present invention is an asymmetric and multiple STI. As shown in FIG. 15, the STI 370 comprises a main STI 330 and a sub-STI 362 positioned on at least one side of the main STI 330. The sub-STI 362 comprises a dielectric layer such as a silicon dioxide layer, a silicon oxynitride layer, or a silicon nitride layer while the material filling the main STI 330 can be identical to or different from that in the sub-STI 362. Please refer to FIG. 15 again. The existence of the sub-STI 362 prevents the contiguous point 380 of the epitaxial silicon layer 352, the substrate 300, and the main STI 330 from explosion and from consumption during the following etching or cleaning processes. The existence of the sub-STI 362 also prevents the contiguous point 380 from reacting with a metal layer in the salicide process, therefore the salicide layer will not be formed under the main STI 330 through the excessively consumed contiguous point 380. Accordingly, current leakage is also prevented.

As abovementioned, because seams are formed in between epitaxial silicon layers and STIs after a SEG process, a deposition is performed to fill the seams with a dielectric layer after the SEG process. In other words, the contiguous point of the epitaxial silicon layer, the substrate, and the STI is filled with the dielectric layer, therefore the contiguous point is prevented from downward etching in the following etching or cleaning processes. The problems of excessive consumption to the substrate through the seams in the salicide process and current leakage caused from the salicide formed under the STI are also prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a MOS transistor comprising steps of:
   providing a substrate having at least a gate structure having a hard mask layer and a cap layer formed thereon and a shallow trench isolation (STI);
   performing a first etching process to form recesses in the substrate respectively on two sides of the gate structure;
   performing a selective epitaxial growth (SEG) process to form epitaxial silicon layers in the recesses respectively, a seam being accordingly formed between the epitaxial silicon layer and the STI;
   performing a deposition process to deposit a dielectric layer on the substrate, the dielectric layer filling the seams;
   performing a second etching process to remove the dielectric layer except the seams, the hard mask layer, and the cap layer after the deposition process; and
   performing a self-aligned silicidation (salicide) process.

2. The method of claim 1 wherein the gate structure further comprises:
   a gate dielectric layer;
   a gate conductive layer formed on the gate dielectric layer; and
   a spacer formed on sidewalls of the gate conductive layer.

3. The method of claim 1 further comprising a first pre-cleaning step performed after the first etching process to remove residuals from the substrate and the recesses.

4. The method of claim 1 further comprising a step of forming a salicide barrier (SAB) layer before performing the salicide process.

5. The method of claim 4 further comprising a second pre-cleaning step performed after forming the SAB layer to remove residuals from the substrate, the gate structure, and the epitaxial silicon layers.

6. The method of claim 4 wherein the SAB layer comprises silicon dioxide or silicon nitride.

7. The method of claim 1 wherein the dielectric layer comprises silicon oxide, silicon oxynitride, or silicon nitride.

8. The method of claim 1 wherein the deposition process further comprises a high density plasma chemical vapor deposition (HDP-CVD), atmosphere pressure chemical vapor deposition (APCVD), sub-atmosphere chemical vapor deposition (SACVD), low pressure chemical vapor deposition (LPCVD), or plasma enhanced chemical vapor deposition (PECVD).

9. The method of claim 1 wherein the second etching process comprises a dry etching process or a wet etching process.

10. The method of claim 1 wherein the gate structure is a gate structure of a PMOS transistor.

11. The method of claim 10, wherein the epitaxial silicon layer comprises silicon germanium (SiGe).

12. The method of claim 10, wherein the epitaxial silicon layer comprises silicon carbide (SiC).

13. The method of claim 1 wherein the gate structure is a gate structure of an NMOS transistor.

* * * * *